United States Patent
Kawai

(10) Patent No.: US 10,477,730 B2
(45) Date of Patent: Nov. 12, 2019

(54) HEAD-MOUNTED DISPLAY AND GRIPPING APPARATUS

(71) Applicant: CANON KABUSHIKI KAISHA, Tokyo (JP)

(72) Inventor: Toshiharu Kawai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/485,077

(22) Filed: Apr. 11, 2017

(65) Prior Publication Data

US 2017/0311483 A1 Oct. 26, 2017

(30) Foreign Application Priority Data

Apr. 20, 2016 (JP) .................................. 2016-084730

(51) Int. Cl.
*H05K 7/20* (2006.01)
*G06T 11/60* (2006.01)
*G02B 27/01* (2006.01)

(52) U.S. Cl.
CPC ..... *H05K 7/20481* (2013.01); *G02B 27/0176* (2013.01); *H05K 7/20963* (2013.01); *G06T 11/60* (2013.01)

(58) Field of Classification Search
CPC .. H05K 7/20481; H05K 7/20963; H05K 7/20; H05K 1/0203; H05K 1/182; H05K 1/189; H05K 2201/066; H05K 5/0017; H05K 7/2039; G02B 27/017; G06F 1/163; G06F 3/014; G06F 3/011; G06F 3/012; F21V 29/70; F21V 29/50
See application file for complete search history.

(56) References Cited

U.S. PATENT DOCUMENTS

| 2005/0199367 | A1 | 9/2005 | Romahn |
| 2007/0177239 | A1 | 8/2007 | Tanijiri |
| 2015/0201530 | A1 | 7/2015 | Liu |
| 2016/0011424 | A1 | 1/2016 | Thurber |
| 2016/0085278 | A1* | 3/2016 | Osterhout ............... G06F 1/206 361/679.03 |
| 2016/0179148 | A1* | 6/2016 | Takagi .................... G06F 1/203 345/8 |

(Continued)

FOREIGN PATENT DOCUMENTS

| CN | 2672861 Y | 1/2005 |
| CN | 200966201 Y | 10/2007 |

(Continued)

*Primary Examiner* — James Wu
*Assistant Examiner* — Michael A Matey
(74) *Attorney, Agent, or Firm* — Canon U.S.A. Inc., IP Division

(57) ABSTRACT

A head-mounted display configured to display an image to a user includes a protruding member disposed on an outer surface member of the head-mounted display, and in proximity to a heat generation source arranged inside the head-mounted display, and a heat transfer member disposed between the protruding member and the heat generation source, and arranged to be deformable along a shape of the protruding member. Therefore, the present invention is directed to providing a head-mounted display or a gripping apparatus capable of preventing the occurrence of thermal concentration without impairing an observer's feeling of use.

10 Claims, 8 Drawing Sheets

(56) References Cited

U.S. PATENT DOCUMENTS

2016/0195726 A1* 7/2016 Fujishiro ............ G02B 27/0176
    345/8
2016/0209654 A1* 7/2016 Riccomini ......... G02B 27/0172
2016/0212879 A1* 7/2016 Nikkhoo ............ H05K 7/20127
2016/0255748 A1* 9/2016 Kim ................... H05K 7/20972
    361/695
2017/0097509 A1* 4/2017 Yoshida ............. G02B 27/0176
2017/0184863 A1* 6/2017 Balachandreswaran .....................
    G02B 27/0176

FOREIGN PATENT DOCUMENTS

| | | |
|---|---|---|
| CN | 101368713 A | 2/2009 |
| CN | 201263281 Y | 6/2009 |
| JP | 2004-6791 A | 1/2004 |
| JP | 2013-054076 A | 3/2013 |
| JP | 2013-218968 A | 10/2013 |
| JP | 2014-049536 A | 3/2014 |
| TW | 201528927 A | 7/2015 |
| WO | 2015/148442 A1 | 10/2015 |

* cited by examiner

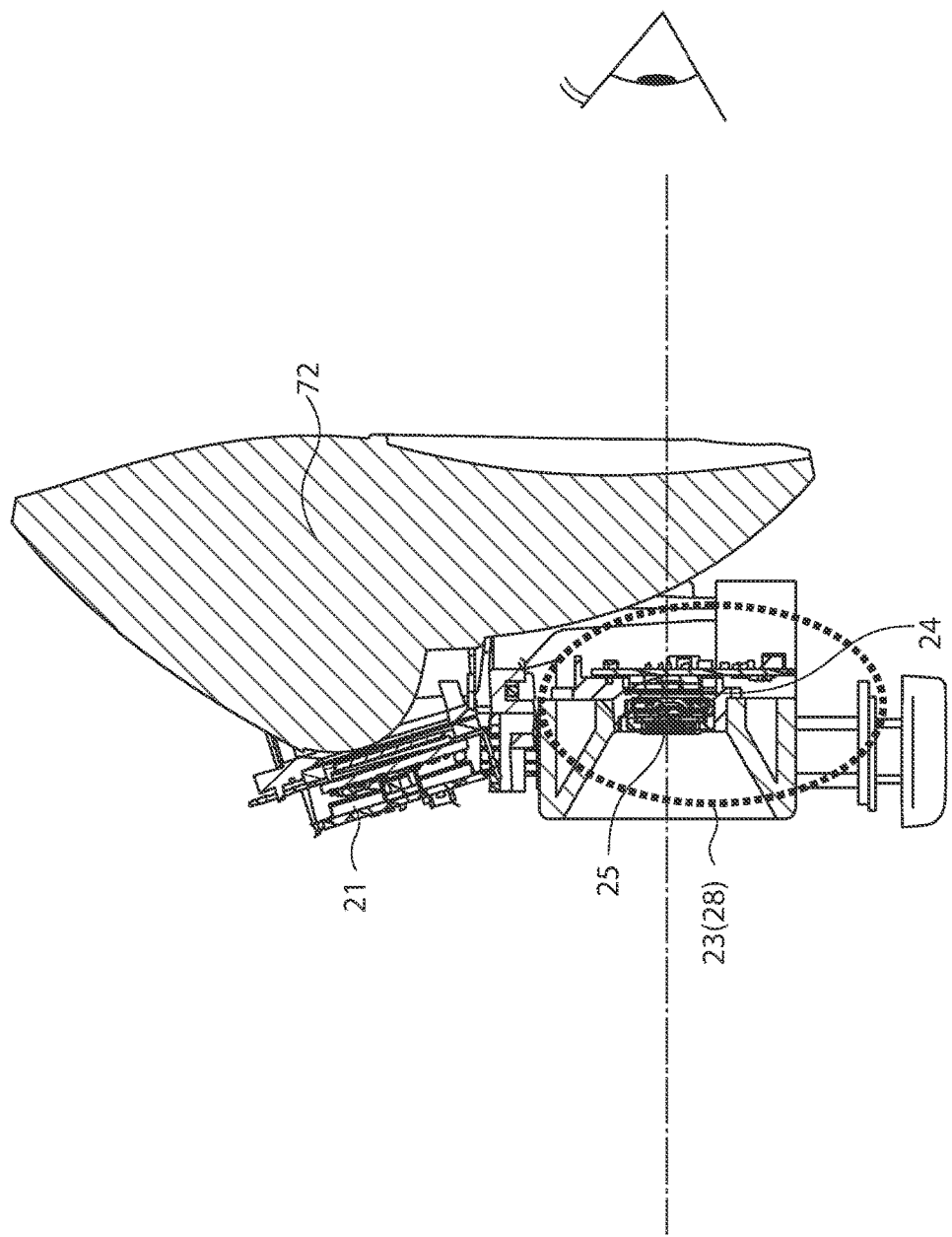

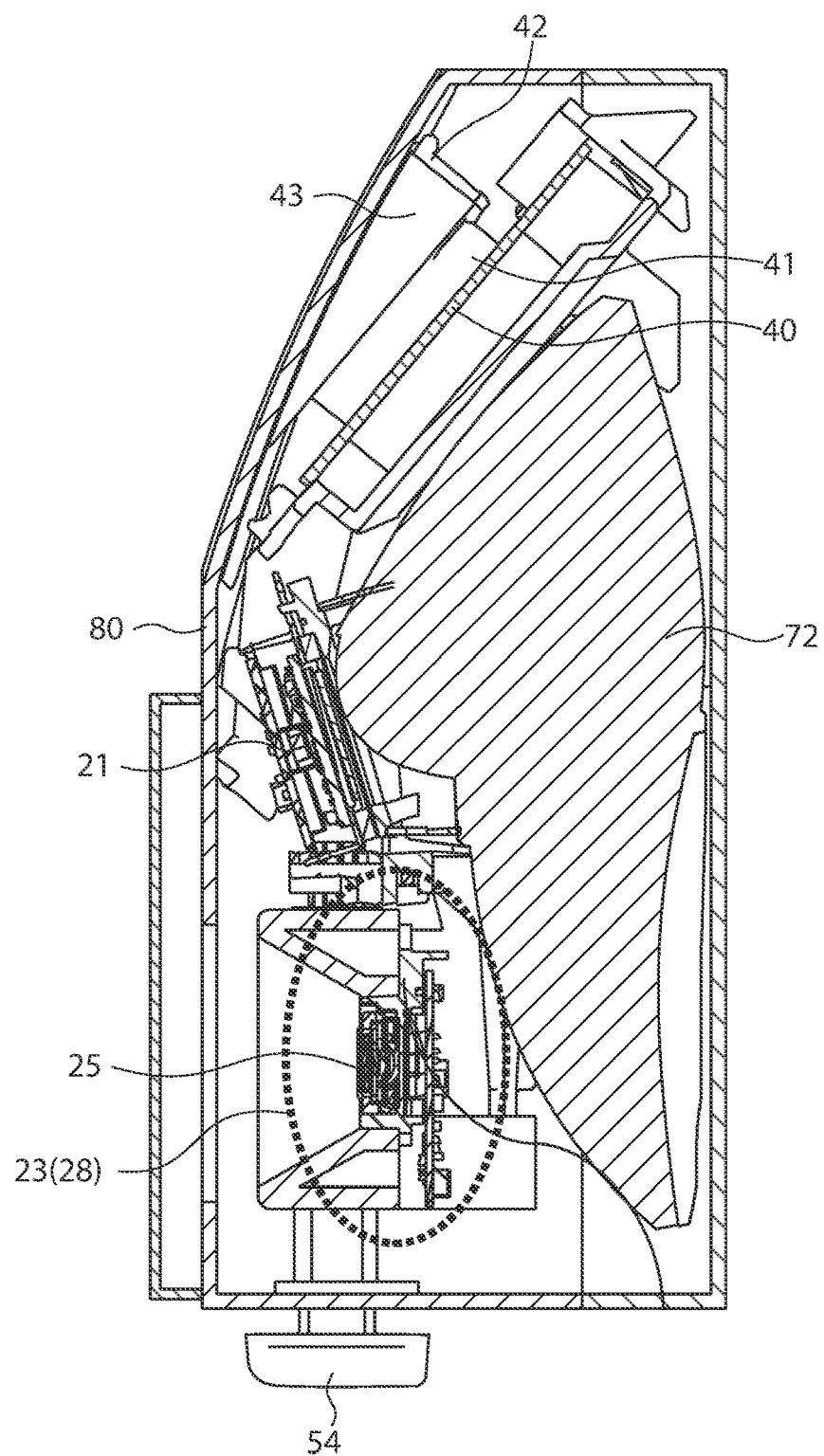

HEAD-MOUNTED DISPLAY AND GRIPPING APPARATUS

BACKGROUND OF THE INVENTION

Field of the Invention

The present invention relates to a head-mounted display used by being mounted on the head of an observer, and a gripping apparatus used by being gripped by the observer.

Description of the Related Art

In recent years, a head-mounted display (HMD) mounted on an observer's head is coming into use. The HMD includes a display unit for displaying a video in front of the observer's eyes. Because of the capabilities of easily providing video display on a large screen and a binocular vision, the HMD is used as an apparatus for having an experience of virtual reality (VR) and mixed reality (MR).

An HMD for achieving MR includes imaging units for capturing images of a subject corresponding to the observer's right and left eyes, and a display unit and observation optical systems for displaying images. The display unit superimposes the images captured by the imaging units and a three-dimensional computer graphic (3DCG) image generated by a personal computer (PC), and displays the superimposed images. The display unit displays videos to be projected to the observer on display elements, such as small liquid crystal panels, corresponding to the observer's right and left eyes, magnifies the videos via the above-described observation optical systems corresponding to the observer's right and left eyes, and then projects the videos on the observer's right and left eyeballs. Then, the captured images of the subject have a parallax corresponding to the right and left eyes. The display unit generates parallax images corresponding to the observer's right and left eyes and superimposes the parallax images onto videos captured by the imaging units, thus generating a video representation with which the observer feels as if a virtual 3DCG image exists in the real world.

Generally, with the increase in the viewing angle and image quality of imaging units and display elements of an HMD, the power consumption and the heat release value tend to increase with increasing number of pixels and increasing load on image processing. One of possible heat release measures is to dispose a cooling unit such as a fan or vent holes for releasing the heat. However, the cooling unit such as a fan generates noise and vibration, which may cause a feeling of discomfort to the observer wearing the HMD. The vent holds are unsuitable for the HMD as an optical device because particulates may enter the inside of the apparatus.

Japanese Patent Application Laid-Open No. 2013-218968 and Japanese Patent Application Laid-Open No. 2004-6791 discuss techniques for transferring the heat of a heat generation source to an outer surface (outer surface member) to release the heat to the outside of an apparatus. However, the technique discussed in Japanese Patent Application Laid-Open No. 2013-218968 does not take into consideration a phenomena that the heat is likely to concentrate at a contact portion between a heat transfer member and the outer surface. Accordingly, when the outer surface is made of a plastic having low thermal conductivity, the heat may concentrate at a heat transfer portion. Therefore, this technique is unsuitable for an apparatus used in the vicinity of an observer, such as an HMD. The technique discussed in Japanese Patent Application Laid-Open No. 2004-6791 transmits the heat to the outer surface (outer surface member) by using a heat transfer member in a similar way. However, this technique does not take into consideration a phenomena that the heat is likely to concentrate at a contact portion between the heat transfer member and the outer surface.

SUMMARY OF THE INVENTION

The present invention is directed to providing a head-mounted display or a gripping apparatus capable of preventing the occurrence of thermal concentration without impairing an observer's feeling of use.

According to an aspect of the present invention, a head-mounted display configured to display an image to a user includes a protruding member disposed on an outer surface member of the head-mounted display, and in proximity to a heat generation source arranged inside the head-mounted display, and a heat transfer member disposed between the protruding member and the heat generation source, and arranged to be deformable along a shape of the protruding member.

According to another aspect of the present invention, a gripping apparatus configured to display an image to a user includes a protruding member disposed on an outer surface member of the head-mounted display, and in proximity to a heat generation source arranged inside the head-mounted display, and a heat transfer member disposed between the protruding member and the heat generation source, and arranged to be deformable along a shape of the protruding member.

Further features of the present invention will become apparent from the following description of exemplary embodiments with reference to the attached drawings.

BRIEF DESCRIPTION OF THE DRAWINGS

FIG. 4 is a sectional view illustrating the optical unit illustrated in FIG. 3 cut by a plane parallel to an optical axis along which the observer observes a video.

FIG. 5 is a longitudinal sectional view illustrating an HMD main body indicating a heat generation unit and a heat release configuration unit according to the present exemplary embodiment.

DESCRIPTION OF THE EMBODIMENTS

An exemplary embodiment of the present invention will be described below with reference to the accompanying drawings.

Figure 1:
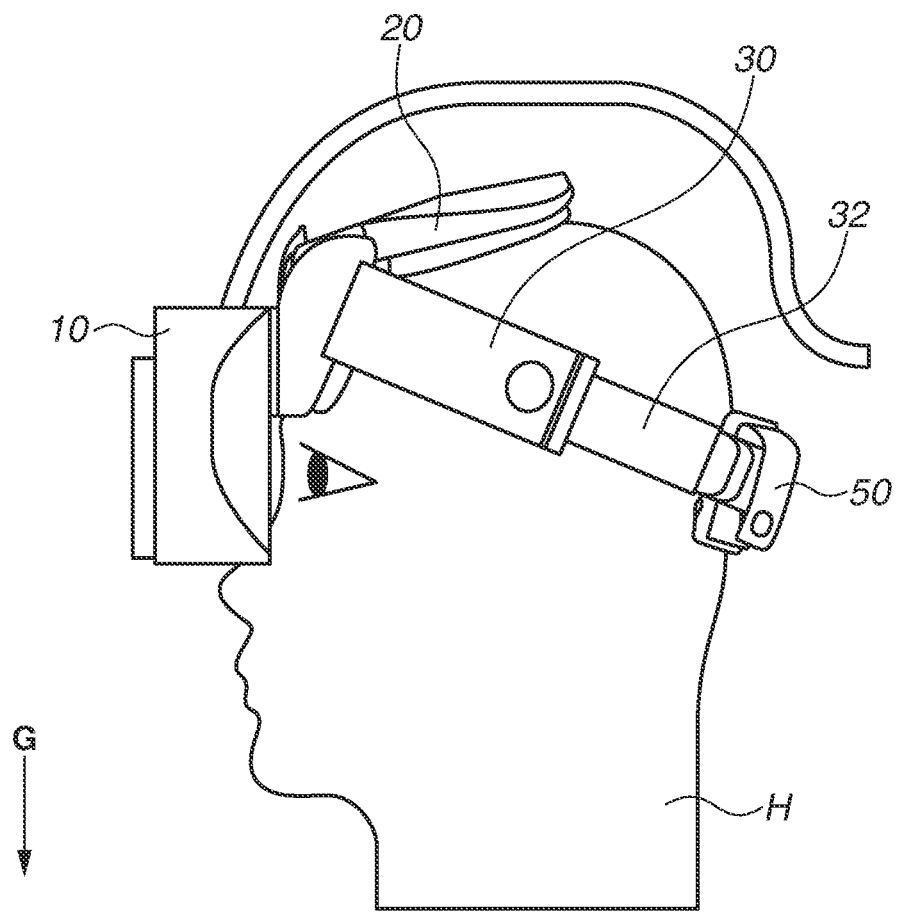
FIG. 1 is a side view illustrating a state where an observer wears a head-mounted display (HMD) according to the present exemplary embodiment.

FIG. 1 is a side view illustrating a head-mounted display (hereinafter abbreviated to an HMD) used by being mounted on an observer's head according to a first exemplary embodiment. An HMD main body 10 includes an optical unit 11 to be described below (not illustrated). A frame 30 is disposed along the head of an observer H. A flexible band member 32 is, for example, made of a thin plate of polypropylene and is deformable along the head of the observer H. The HMD can be bound to the head of the observer H by changing the total length of the band member 32. Pad members 20 and 50 contact the head of the observer H to stably and comfortably fix the HMD main body 10 to the observer H.

The observer H changes the total length of the band member 32 to bind and fix the HMD main body 10 to the head of the observer H. Bringing the pad members 20 and 50 in contact with the head of the observer H enables distributing the binding pressure to allow the observer H to comfortably wear the HMD.

The HMD main body 10 illustrated in FIG. 1 is provided with a mounting system and is configured to be fixed to the head of the observer H. Fixing the HMD main body 10 to the head of the observer H using the mounting system enables freeing both hands of the observer H to allow him or her to perform various operations. However, when one HMD is shared by a plurality of persons, the method for fixing the HMD to the head may have some disadvantages, such as the difficulty in handling the HMD when changing the wearer of the HMD and the possibility that some observers may care about sanitation.

Therefore, it is assumed that the mounting system is removed from the HMD main body 10 to use the apparatus in a gripping form.

Figure 2:
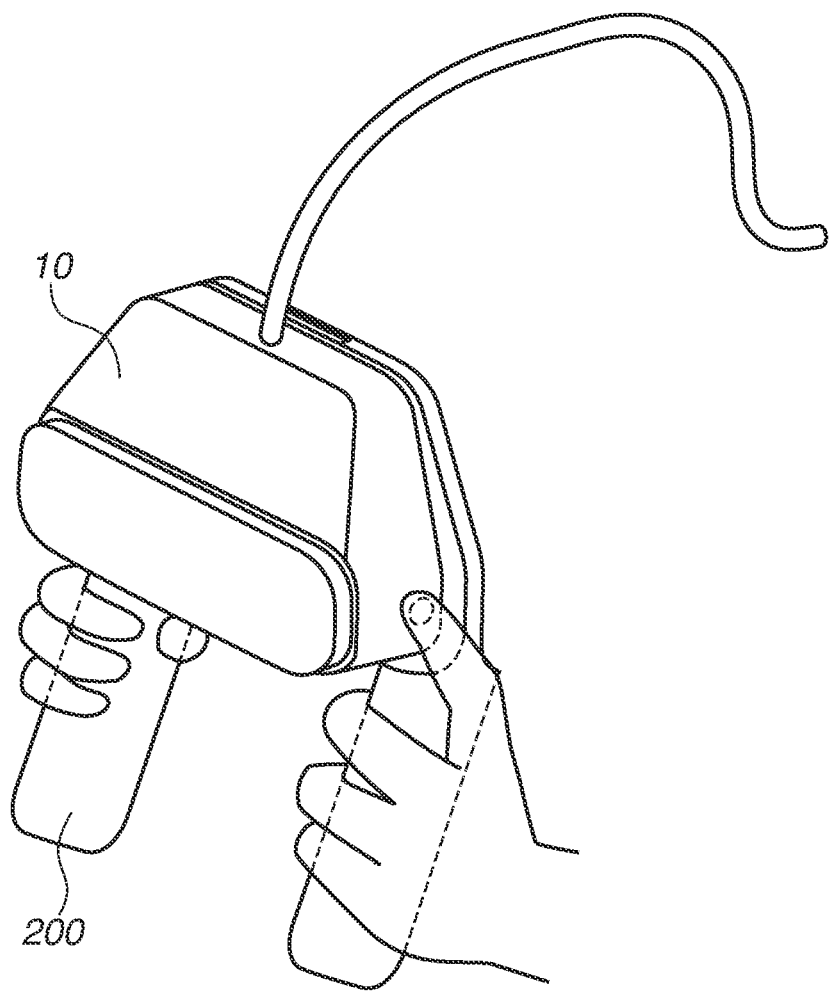
FIG. 2 is a schematic view illustrating a case where a form of the HMD according to the present exemplary embodiment is changed to a gripping form.

FIG. 2 schematically illustrates the form of a handheld display (HHD) as a gripping apparatus to be used in a gripping form. If the HMD main body 10 is separated from the mounting system and connected to a gripping unit 200, the observer H can observe a video by gripping the apparatus with both hands. The use as an HHD resolves the above-described disadvantages in handling and wearing, and enables providing an environment where a plurality of persons can comfortably use the apparatus.

Figure 3:
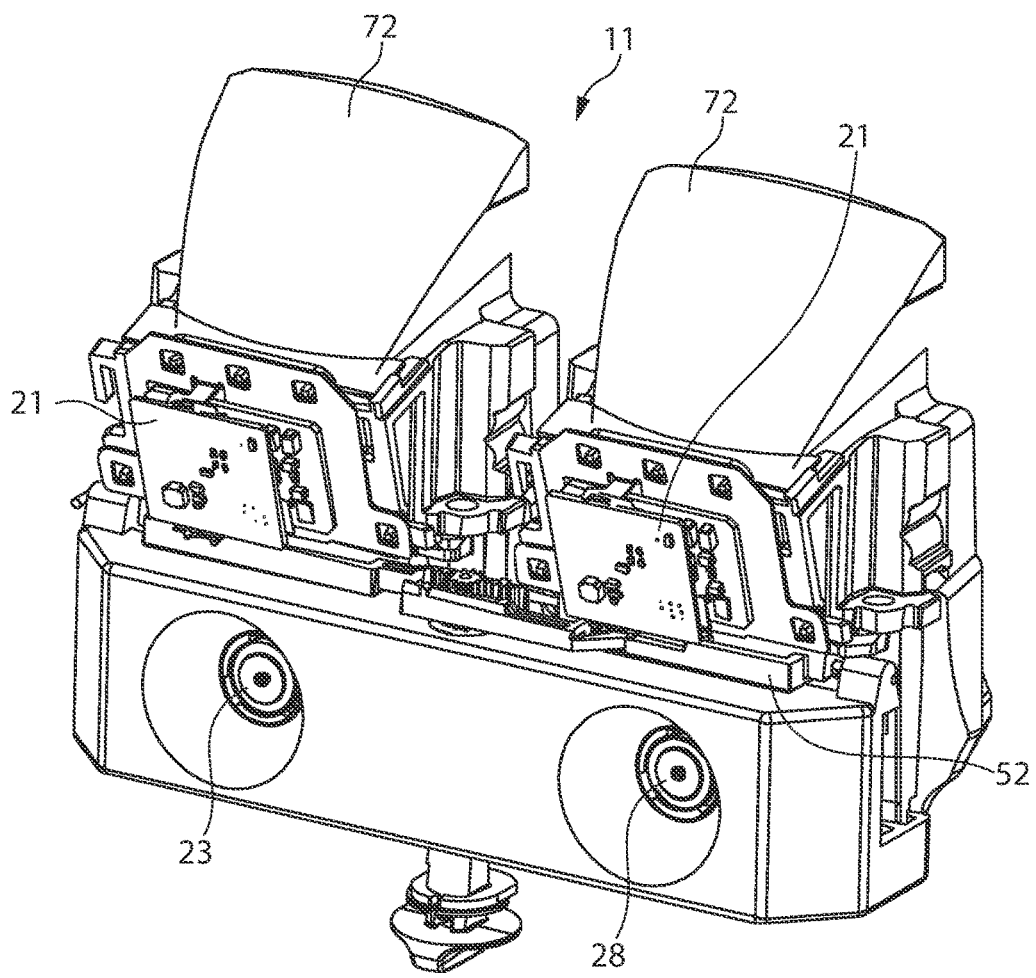
FIG. 3 is a perspective view illustrating an optical unit disposed inside the HMD according to the present exemplary embodiment.

FIG. 3 is a perspective view illustrating the optical unit 11 disposed inside a first HMD main body 10 according to the present exemplary embodiment. FIG. 4 is a sectional view illustrating the optical unit 11 on the side of one eye, cut by a plane perpendicular to the optical axis of the observer. Referring to FIGS. 3 and 4, a video display element 21 displays a two-dimensional video generated by an apparatus such as a PC. The video display element 21 is composed of an organic electroluminescence (EL) element, or an image display element with a two-dimensional matrix such as a liquid crystal element, and functions as a display unit. However, the video display element 21 is not limited to an image display element with a two-dimensional matrix, and may be a video display element of a scanning type. A prism 72 is an element which configures an observation optical system for magnifying a video displayed on the video display element 21 and projects the video on an observer's eyeball. The video display element 21 and the prism 72 are disposed in front of each of the observer's right and left eyes.

A video displayed on the video display element 21 passes through the prism 72 to be magnified. Magnified videos are displayed in front of the observer's right and left eyes to allow the observer to obtain a high feeling of immersion. Subjective cameras 23 and 28 capture images equivalent to the observer's view, each including an image sensor 24 and a subjective camera lens 25 for forming an image on the image sensor 24. The imaging optical axes of the subjective cameras 23 and 28 approximately coincide with the observation optical axis along which the observer observes the first prism 72. The subjective cameras 23 and capture images in the line-of-sight direction of the observer.

Videos captured by the subjective cameras 23 and 28 are transmitted to an external apparatus such as a PC via a cable (not illustrated) connected to the substrates of the image sensors 24. For example, another screen such as a computer graphics (CG) image is generated in a captured image input to the external apparatus such as a PC, superimposed onto the captured images, and then displayed on the video display elements 21. More specifically, right and left images having a parallax are generated in the CG image to be displayed on the right and left video display elements 21, and displayed in the video display elements 21. This configuration allows the observer to observe a video as if the CG generated by the PC exists in the real world captured by the subjective cameras 23 and 28.

Figure 6A:
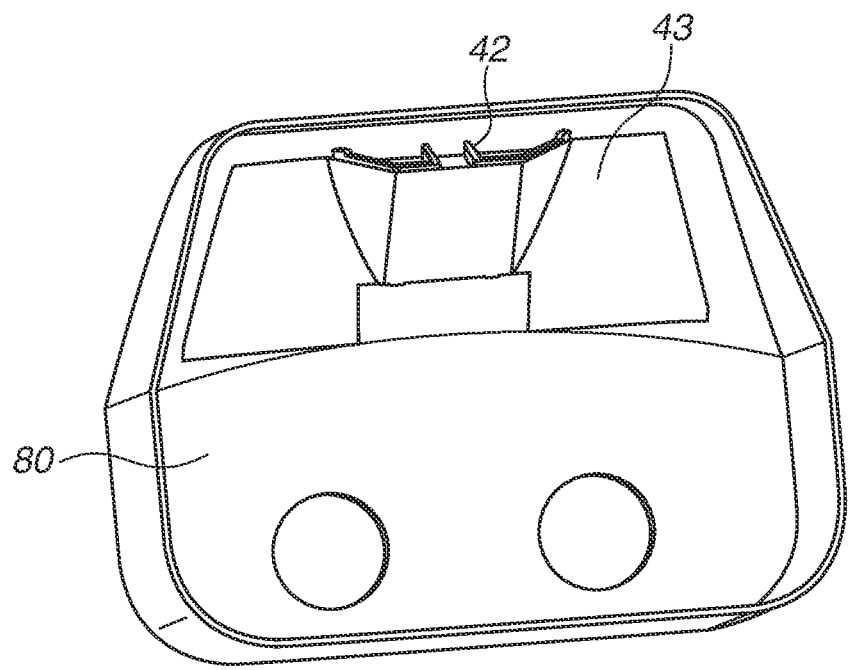
FIGS. 6A and 6B are perspective views each illustrating an outer surface member, and an attachment condition of a protruding member and a heat transfer member disposed on the outer surface member according to the present exemplary embodiment.
Figure 6B:
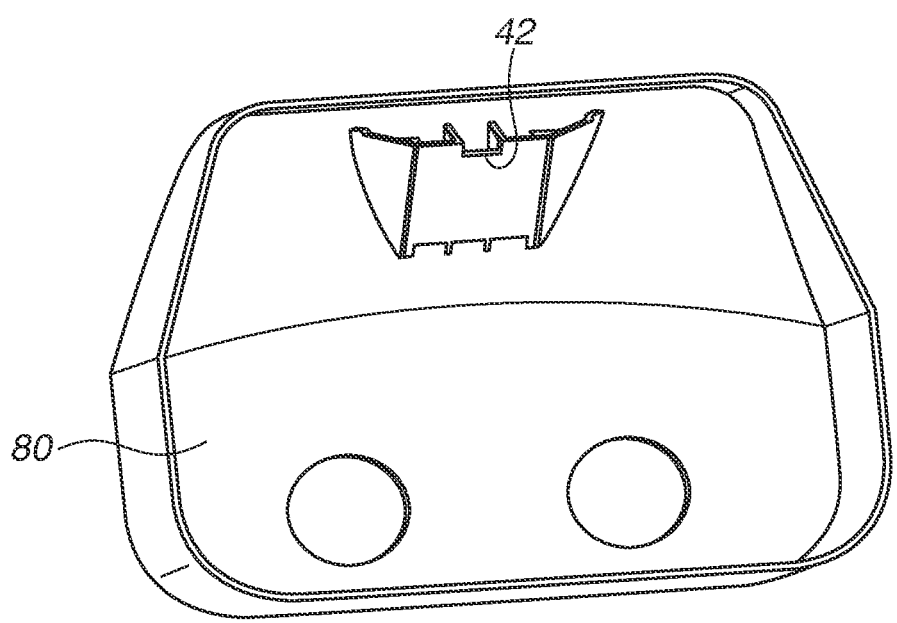

FIGS. 5, 6A and 6B illustrate the heat generation source and the heat release therefrom according to the present exemplary embodiment. FIG. 5 is a longitudinal sectional view illustrating the HMD main body 10. The optical unit 11 includes, at the upper part, a substrate 40, an element 41 as a heat generation source disposed on the substrate 40, a protruding member 42 disposed on an outer surface member 80 and in proximity to the element 41, and a heat transfer member 43 made of a copper foil disposed so as to spread over the outer surface member 80 and the protruding member 42. The heat transfer member 43 and the element 41 contact at the protruding portion of the protruding member 42. FIGS. 6A and 6B illustrate conditions of the outer surface member 80, the protruding member 42, and the heat transfer member 43. As illustrated in FIG. 6B, the protruding member 42 is disposed on the outer surface member 80. As illustrated in FIG. 6A, the heat transfer member 43 is disposed so as to spread over the outer surface member 80 and the protruding member 42. Since the heat transfer member 43 having a sheet-like shape is flexible and deformable, it is deformed along and in close contact with the outer surface member 80 having a curved shape and the protruding member 42. In the present exemplary embodiment, a copper foil tape is used as the heat transfer member 43 and is stuck on the outer surface member 80 and the protruding member 42 by the adhesive force of the tape. The heat transfer member 43 may be made of other materials having flexibility and high thermal conductivity, such as a graphite sheet. Alternatively, a plurality of copper foil tapes may be stuck in a laminated way to increase the amount of heat transfer. Copper foils and graphite sheets are commercially available in the form of a copper foil tape with an adhesive. The heat transfer member 43 can be easily prepared by using a copper foil or a graphite sheet, and then attached to the protruding member 42 and the outer surface member 80.

Figure 7:
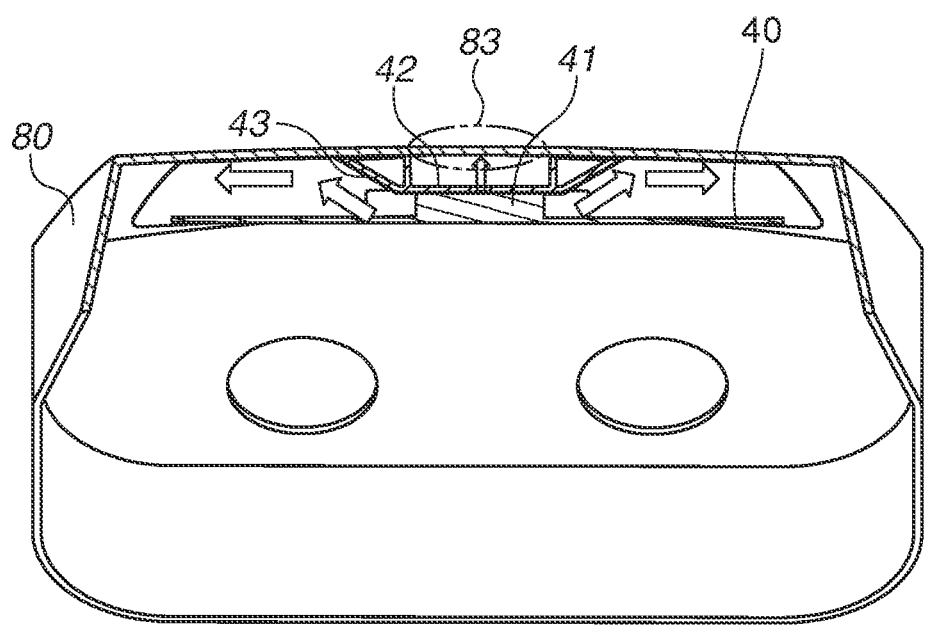
FIG. 7 is a lateral sectional view illustrating the generation unit and the heat release configuration unit illustrated in FIG. 5.

FIG. 7 is a lateral sectional view illustrating the heat transfer member 43 which receives the heat from the element 41 and transfers the heat to the protruding member 42 and the outer surface member 80. The protruding member 42 is made of a material having lower thermal conductivity than the heat transfer member 43. This restrains the heat transfer to a portion 83 of the outer surface member 80 directly under the protruding member 42 having a shortest distance from the element 41 as a heat generation source, which alleviates a local temperature rise at the portion 83. In a case where the heat transfer member 43 does not exist and only the protruding member 42 exists, configuring the protruding member 42 using a material having high thermal conductivity enables transferring the heat of the element 41 to the outer surface member 80, thus preventing a temperature rise in the element 41. However, the heat may concentrate on the portion 83 of the outer surface member 80 which may cause an abnormal condition such as an excessive temperature rise.

Figure 8:
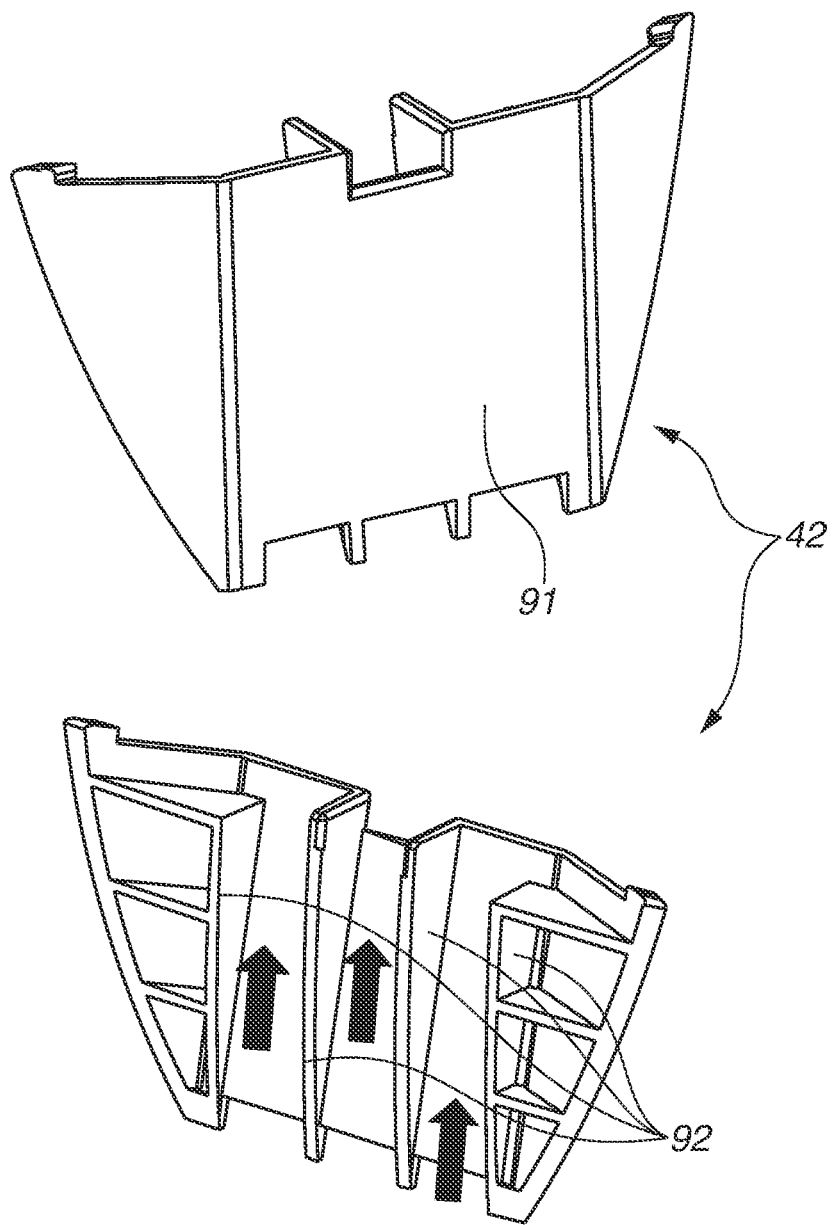
FIG. 8 is a perspective view illustrating in detail the protruding member according to the present exemplary embodiment.

FIG. 8 is a perspective view illustrating a shape of the protruding member 42 which is composed of a surface 91 in contact with the element 41 via the heat transfer member 43, and ribs 92 configuring surfaces in contact with the outer surface member 80. Configuring the surface 91 so as to be similar to the surface shape of the element 41 (flat surface according to the present exemplary embodiment) enables increasing a contact area between the heat transfer member 43 and the element 41 to improve the heat transfer efficiency. The shape of the protruding member 42 enables favorable thermal connection between the heat transfer member 43 and the element 41 even with different surface shapes and angles between the outer surface member 80 and the element 41. This improves the degree of freedom in shape of the outer surface member 80 as an outer appearance. Inserting a heat-resistant member having elasticity and high heat resistance, such as a silicon rubber, between the heat transfer member 43 and the element 41 or between the heat transfer member 43 and the protruding member 42 enables absorbing a positioning error and a shape error between the protruding member 42 and the element 41. As a result, a stable thermal connection between the heat transfer member 43 and the element 41 can be achieved. Configuring the protruding member 42 to come in contact with the outer surface member 80 via the shapes of the ribs 92 enables reducing the contact area between the protruding member 42 and the outer surface member 80. Moreover, limiting the heat transfer from the protruding member 42 to the outer surface member 80 enables alleviating thermal concentration at the contact portion (portion 83 illustrated in FIG. 7). Air layers formed between the ribs 92 also contribute to the shielding of heat. Although, in the present exemplary embodiment, the protruding member 42 and the outer surface member 80 are made of different materials, the protruding member 42 may be integrally formed with the outer surface member 80 as long as the condition of lower thermal conductivity than the heat transfer member 43 is satisfied. Configuring the ribs 92 to form air flow paths between the protruding member 42 and the outer surface member 80 as illustrated FIG. 8 provides natural convection for preventing the stagnation of heated air in the protruding member 42. This also enables preventing thermal concentration at the contact portion (the portion 83 illustrated in FIG. 7).

As described above, according to the present exemplary embodiment, the heat developed in the HMD main body 10 can be transferred to the outer surface member 80 to release the heat to outside air. This enables preventing a local temperature rise at part of the outer surface member 80. Further, disposing the protruding member 42 between the outer surface member 80 and the element 41 and using a flexible material as the heat transfer member 43 enable configuring the outer surface member 80 even with a complicated outer appearance shape, such as a three-dimensional curved surface. This configuration improves the degree of freedom in shape of the outer surface member 80. The outer surface member 80 provided with the protruding member 42 is the surface on the opposite side of the head of the user wearing the HMD main body 10, and therefore decreases the amount of internal heat transferred to the user side. Since the HMD main body 10 is configured without using any heat discharging unit which generates noise and vibration, such as a fan, user's comfort can be improved. Further, since heat discharge is not performed by exchanging air with the outside of the HMD main body 10, vent holes do not need to be provided. Therefore, it is possible to reduce dust entry which will cause a problem in an optical device such as the apparatus according to the present exemplary embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-084730, filed Apr. 20, 2016, which is hereby incorporated by reference herein in its entirety.

What is claimed is:

1. A head-mounted display configured to display an image to a user, the head-mounted display comprising:
a protruding member disposed on an outer surface member of the head-mounted display, and in proximity to a heat generation source arranged inside the head-mounted display; and
a heat transfer member disposed between the protruding member and the heat generation source, and arranged to be deformable along an outer shape of the protruding member,
wherein the heat transfer member is in contact with the heat generation source at one side and in contact with an outside of the protruding member at the other side, and
wherein the protruding member includes ribs and is contact with the outer surface member of the head-mounted display by the ribs.

2. The head-mounted display according to claim 1, wherein the heat transfer member has a sheet-like shape.

3. The head-mounted display according to claim 1, wherein the heat generation source is an element disposed on a substrate inside the head-mounted display.

4. The head-mounted display according to claim 1, wherein the protruding member is made of a material having lower thermal conductivity than the heat transfer member.

5. The head-mounted display according to claim 1, wherein, when the head-mounted display is mounted on the observer's head, the protruding member is oriented in a different direction from the head.

6. The head-mounted display according to claim 1, wherein the shape of the protruding member is similar to a shape of the heat generation source.

7. The head-mounted display according to claim 1, wherein an air layer is formed between the heat generation source and the outer surface member by the protruding member.

8. The head-mounted display according to claim 1, wherein the heat transfer member is formed of a graphite sheet.

9. The head-mounted display according to claim 1, wherein a heat-resistant member is disposed between the heat transfer member and the heat generation source.

10. A gripping apparatus configured to display an image to a user, the gripping apparatus comprising:

a protruding member disposed on an outer surface member of the head-mounted display, and in proximity to a heat generation source arranged inside the head-mounted display; and a heat transfer member disposed between the protruding member and the heat generation source, and arranged to be deformable along an outer shape of the protruding member, wherein the heat transfer member is in contact with the heat generation source at one side and in contact with an outside of the protruding member at the other side, and wherein the protruding member includes ribs and is contact with the outer surface member of the head-mounted display by the ribs.

* * * * *